(12) United States Patent
Kook et al.

(10) Patent No.: US 11,718,915 B2
(45) Date of Patent: Aug. 8, 2023

(54) DRUM FOR ROLL-TO-ROLL DEPOSITION, ROLL-TO-ROLL DEPOSITION APPARATUS AND FILM ROLL

(71) Applicant: LG Display Co., Ltd., Seoul (KR)

(72) Inventors: Yunho Kook, Paju-si (KR); Namkook Kim, Suwon-si (KR); Seunghyun Youk, Paju-si (KR); Sungwoo Choi, Seoul (KR); Hwankeon Lee, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 332 days.

(21) Appl. No.: 16/190,752

(22) Filed: Nov. 14, 2018

(65) Prior Publication Data

US 2019/0186016 A1   Jun. 20, 2019

(30) Foreign Application Priority Data

Dec. 20, 2017   (KR) .................. 10-2017-0176448

(51) Int. Cl.
*C23C 16/54*       (2006.01)
*B65H 20/00*     (2006.01)
(Continued)

(52) U.S. Cl.
CPC ........... *C23C 16/545* (2013.01); *B65H 20/00* (2013.01); *B65H 20/10* (2013.01); *C23C 16/45563* (2013.01)

(58) Field of Classification Search
CPC ................ C23C 16/545; C23C 14/562; B65H 2404/4213
See application file for complete search history.

(56) References Cited

U.S. PATENT DOCUMENTS 6,044,792 A * 4/2000 Ogawa .................. C23C 16/517
                                                                118/723 E
6,312,524 B1   11/2001 Ogawa et al.
(Continued)

FOREIGN PATENT DOCUMENTS

CN          201686330 U       12/2010
CN          105980598 A        9/2016
(Continued)

OTHER PUBLICATIONS

China National Intellectual Property Administration, Office Action, CN Patent Application No. 201811360866.8, dated Sep. 21, 2020, 17 pages.
(Continued)

*Primary Examiner* — Aiden Lee
(74) *Attorney, Agent, or Firm* — Fenwick & West LLP

(57) ABSTRACT

Disclosed herein is a drum for roll-to-roll deposition to rotate about a longitudinal axis. The drum is circular in a widthwise cross-section and has a shape in which opposite longitudinal edge portions each have a narrower width than a longitudinal central portion. By using the drum for roll-to-roll deposition according to embodiments of the present disclosure, it is possible to remove wrinkles occurring on a flexible substrate when a roll-to-roll deposition process is performed. As a result, it is possible to manufacture a film roll having a deposition layer with excellent widthwise thickness uniformity.

4 Claims, 7 Drawing Sheets

(51) Int. Cl.
*C23C 16/455* (2006.01)
*B65H 20/10* (2006.01)

(56) References Cited

U.S. PATENT DOCUMENTS

| | | |
|---|---|---|
| 6,367,411 B2 | 4/2002 | Ogawa et al. |
| 9,333,525 B2 | 5/2016 | Ries et al. |
| 2002/0011212 A1 | 1/2002 | Ogawa et al. |
| 2014/0290861 A1* | 10/2014 | Dieguez-Campo ......................... C23C 16/45519 156/345.31 |
| 2015/0110960 A1* | 4/2015 | Sauer ....................... B05D 1/60 427/294 |
| 2015/0158048 A1 | 6/2015 | Ries et al. |

FOREIGN PATENT DOCUMENTS

| | | |
|---|---|---|
| CN | 205954097 U | 2/2017 |
| CN | 206599603 U | 10/2017 |
| JP | 2001-323380 A | 11/2001 |
| KR | 10-1998-0024307 A | 7/1998 |
| KR | 10-2017-0079363 A | 7/2017 |
| WO | WO 2017/037339 A1 | 3/2017 |

OTHER PUBLICATIONS

Korean Office Action, Korean Intellectual Property Office Patent Application No. 10-2017-0176448, dated May 3, 2022, 10 pages.

\* cited by examiner

Film Flow

Film Flow

DRUM FOR ROLL-TO-ROLL DEPOSITION, ROLL-TO-ROLL DEPOSITION APPARATUS AND FILM ROLL

CROSS-REFERENCE TO RELATED APPLICATION

This application claims priority to Republic of Korea Patent Application No. 10-2017-0176448, filed on Dec. 20, 2017 with the Korean Intellectual Property office, which is incorporated herein by reference in its entirety.

BACKGROUND

Field of Technology

The present disclosure relates to a drum for roll-to-roll deposition capable of removing wrinkles occurring on a flexible substrate in a roll-to-roll deposition process.

Further, the present disclosure relates to a roll-to-roll deposition apparatus including the drum.

Furthermore, the present disclosure relates to a film roll having a wound flexible film, the flexible film on which an inorganic substance or organic substance is deposited.

Description of the Related Art

A general deposition apparatus for manufacturing semiconductors, displays, and light emitting devices includes an atomic layer deposition (ALD) apparatus, a chemical vapor deposition (CVD) apparatus, a plasma enhanced chemical vapor deposition (PECVD) apparatus, and the like. These devices include an enclosed chamber in which a deposition process is performed.

In the deposition process, a wafer or a substrate is loaded into the chamber, and then an organic substance or inorganic substance is deposited on the wafer or the substrate. Here, an internal temperature of the chamber and a temperature of the substrate are controlled during the deposition process by means of a heater disposed inside the chamber.

Further, process gas is supplied into the chamber through a gas distribution device such as a shower head disposed in the chamber.

When the deposition is completed, the chamber is opened and a substrate on which the organic substance or inorganic substance is deposited is unloaded from the chamber.

In such a conventional deposition apparatus, it is impossible to continuously perform the deposition process because the substrate cannot be continuously loaded or unloaded.

In order to overcome the above-described problem, a roll-to-roll deposition apparatus to perform the deposition process while continuously supplying a flexible substrate has been developed. The roll-to-roll deposition apparatus makes it possible to continuously perform the deposition process.

However, when the deposition process is performed by means of the roll-to-roll deposition apparatus, wrinkles may occur on the flexible substrate. It is known that the wrinkles occurring on the flexible substrate in the roll-to-roll deposition process are caused by heat or tension applied to the flexible substrate.

The wrinkles occurring on the flexible substrate may cause a non-uniform thickness of a deposition layer in the deposition process. The non-uniform thickness of the deposition layer may lead to over-etching of a wrinkle portion in a subsequent etching process. The over-etching may bring about various problems such as, for example, damage to a lower film formed on an lower portion of a film to be etched, a step coverage defect between a lower film and an upper film, a misalignment in an exposure process, and the like.

Therefore, there is a need to remove the wrinkles occurring on the flexible substrate in the roll-to-roll deposition process.

SUMMARY

An aspect of the present disclosure provides a drum for roll-to-roll deposition which may effectively remove wrinkles occurring on a flexible substrate in a roll-to-roll deposition process.

Another aspect of the present disclosure provides a roll-to-roll deposition apparatus which may effectively remove wrinkles occurring on a flexible substrate.

Still another aspect of the present disclosure provides a film roll having a flexible film on which an inorganic substance or organic substance is deposited.

According to an aspect of the present disclosure, there is provided a drum for roll-to-roll deposition to rotate about a longitudinal axis. The drum may be circular in a widthwise cross-section. A longitudinal direction of the drum may be orthogonal to a progress direction of a substrate, and may be the same as a width direction of the substrate. Further, the widthwise cross-section of the drum may mean a cross-section cut in a width direction of the drum.

Here, opposite longitudinal edge portions of the drum each have a narrower width than a longitudinal central portion of the drum.

In a conventional drum for roll-to-roll deposition which has a cylindrical structure, widths of opposite longitudinal edge portions of the drum are each the same as a width of a longitudinal central portion of the drum. Wrinkles occurring on a substrate have a property of being pushed to a portion where tension is relatively weak. When the widths of the opposite longitudinal edge portions of the drum are each the same as the width of the longitudinal central portion of the drum, substantially the same tension is applied to a widthwise edge portion of the substrate from a widthwise central portion of the substrate. As a result, the wrinkles of the substrate are hardly pushed to the widthwise edge portion of the substrate, and remain after the deposition.

Conversely, the drum for roll-to-roll deposition according to embodiments of the present disclosure may have a cylindrical structure in which opposite longitudinal edge portions of the drum each have a narrower width than longitudinal central portion of the drum.

According to this structure, tension applied to the widthwise edge portion of the substrate may be lower than that applied to the widthwise central portion of the substrate, so that the wrinkles of the substrate may be easily pushed to the widthwise edge portion of the substrate and removed. As a result, the deposition process may be performed in a state where no wrinkles are present on the substrate, thereby resolving a problem of the non-uniform thickness of the deposition layer.

Preferably, the width of the drum may gradually decrease toward the opposite longitudinal edge portions from the longitudinally central portion, which makes it possible to bring the substrate into face-to-face contact with the surface of the drum, thereby preventing deposition stability from being lowered.

Also, the widths of the opposite longitudinal edge portions of the drum each may be preferably 90% or more of the width of the longitudinal central portion of the drum, which makes it possible to stably bring the substrate into face-to-face contact with the surface of the drum.

In addition, a heating element may be disposed on a surface or inside of the drum for roll-to-roll deposition according to embodiments of the present disclosure. The heating element may be heated by a resistance heating method and serve to provide heat required for the substrate during the deposition process.

According to another aspect of the present disclosure, there is provided a roll-to-roll deposition apparatus including an extracting roller, a drum, a gas supply and a winding roller. The extracting roller may continuously supply a flexible substrate to the drum.

The drum may be in contact with a lower surface of the flexible substrate supplied from the extracting roller and rotate about a longitudinal axis of the drum. Further, the drum may be circular in a widthwise cross-section and have a shape in which opposite longitudinal edge portions of the drum each have a narrower width than a longitudinal central portion of the drum. The gas supply may have a surface that faces the drum, and supply process gas to an upper surface of the flexible substrate to perform deposition. The winding roller may wind the flexible substrate transferred from the drum after completion of the deposition.

The roll-to-roll deposition apparatus according to embodiments of the present disclosure may include the drum which is circular in the widthwise cross-section and has a shape in which the opposite longitudinal edge portions of the drum each have a narrower width than the longitudinal central portion of the drum, and thus may remove the wrinkles occurring on the flexible substrate, thereby resolving a problem of the non-uniform thickness of the deposition layer.

The roll-to-roll deposition apparatus may additionally include at least one roller (a direction switching roller or a tension adjusting roller) to switch a direction of the flexible substrate being transferred or to adjust tension between the extracting roller and the drum. Here, the additionally included roller may also be circular in a widthwise cross-section and have a shape in which opposite longitudinal edge portions thereof each have a narrower width than a longitudinal central portion thereof, thereby further improving the efficiency of removing the wrinkles of the substrate.

Moreover, the gas supply may have a concave surface in not only a width direction but also a longitudinal direction. This structure may allow a distance from the gas supply to the flexible substrate in contact with the drum, i.e., a deposition distance, to be substantially the same. As a result, it is possible to further improve thickness uniformity of the deposition layer.

According to still another aspect of the present disclosure, there is provided a film roll having a flexible substrate wound thereon, and at least one deposition layer made of at least one of an organic substance and an inorganic substance may disposed on the flexible substrate. Here, a widthwise thickness variation of the deposition layer may be 5% or less.

A final product of the roll-to-roll deposition process is a film roll. As described above, when applying the cylindrical drum having a shape in which widths of opposite longitudinal edge portions of the drum are each the same as that of a longitudinal central portion of the drum, the wrinkles may remain on the flexible substrate, resulting in poor thickness uniformity of the deposited film. Conversely, when applying the cylindrical drum having a shape in which the widths of the opposite longitudinal edge portions are each narrower than that of the longitudinally central portion, the wrinkles of the flexible substrate may be removed, thereby exhibiting excellent thickness uniformity in which the widthwise thickness variation of the deposition layer is 5% or less.

The drum for roll-to-roll deposition according to embodiments of the present disclosure may have a shape in which the opposite longitudinal edge portions each have a narrower width than the longitudinally central portion, and the shape of the drum may allow the tension applied to the widthwise edge portion of the substrate to be lower than that applied to the widthwise central portion of the substrate.

Accordingly, the wrinkles of the flexible substrate may be pushed toward the widthwise edge portion of the substrate, and finally may be removed. As a result, the deposition process may be performed in a state where no wrinkles are present on the substrate, and thus it is possible to manufacture a film roll having a small widthwise thickness variation of the deposition layer.

DETAILED DESCRIPTION

Hereinafter, a drum for roll-to-roll deposition, a roll-to-roll deposition apparatus, and a film roll according to embodiments of the present disclosure will be described in detail with reference to the drawings.

Terms such as first, second, etc. may be used herein to describe components. Such terms are not used to define a corresponding component, but are used merely to distinguish the corresponding component from another component.

In describing a positional relationship using phrases such as "component A on component B" and "component A above component B," another component C may be arranged between the components A and B unless the term "immediately" or "directly" is explicitly used.

A longitudinal direction of the drum may be orthogonal to a progress direction of a substrate, and may be the same as a width direction of the substrate. Further, a width direction of the drum may be the same as the progress direction of the substrate, and may be orthogonal to the width direction of the substrate. Furthermore, a widthwise cross-section of the drum may mean a cross-section cut in a width direction of the drum.

Figure 1:
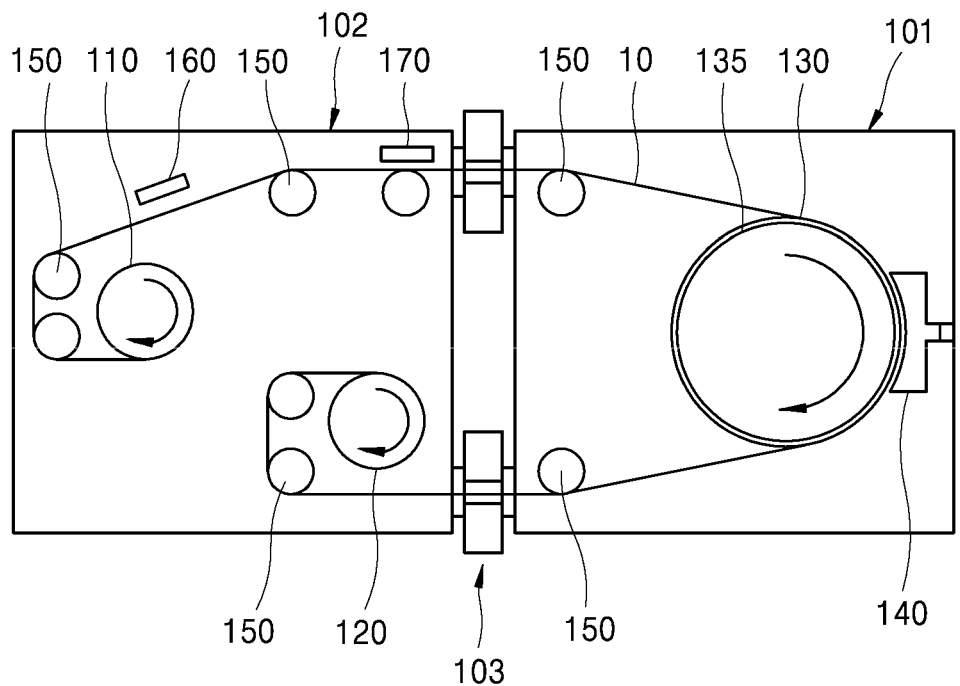
FIG. 1 schematically shows an example of a roll-to-roll deposition apparatus which may be applied to embodiments of the present disclosure.

FIG. 1 schematically shows an example of a roll-to-roll deposition apparatus which is applicable to embodiments of the present disclosure.

Referring to FIG. 1, the roll-to-roll deposition apparatus may include a process chamber 101, an extracting roller 110 and a winding roller 120 disposed outside the process chamber 101, and a drum 130 and a gas supply 140 disposed inside the process chamber 101. As shown in FIG. 1, the extracting roller 110 and the winding roller 120 may be disposed in a preliminary chamber 102, and the process chamber 101 and the preliminary chamber 102 may communicate with each other by opening a slit 103 which is openable and closeable. In addition, the process chamber 101 and the preliminary chamber 102 may be maintained in a vacuum state.

A flexible substrate 10 may be continuously supplied from the extracting roller 110. The drum 130 may rotate in contact with a lower surface of the flexible substrate 10 supplied from the extracting roller 110. The gas supply 140 may have a surface that faces the drum 130 and supply process gas to an upper surface of the flexible substrate 10 to perform deposition of an organic substance and/or an inorganic substance. The winding roller 120 may wind the flexible substrate 10 transferred from the drum 130 after completion of the deposition.

A heating element 135 may be disposed on a surface or inside of the drum 130. The heating element 135 may be made of tungsten (W), nickel-chromium (Ni-Cr), a carbon nano tube (CNT) or the like. The heating element 135 may be heated by a resistance heating method and serve to provide heat required for the flexible substrate 10, e.g., 50 to 300° C. during a deposition process.

Also, referring to FIG. 1, a plurality of rollers 150 may be additionally disposed between the extracting roller 110 and the drum 130 and/or between the drum 130 and the winding roller 120 so as to switch a direction of the flexible substrate 10 or adjust tension of the flexible substrate 10.

Besides, a heater 160 and/or a plasma module 170 may be additionally disposed between the extracting roller 110 and the drum 130. The heater 160 or the plasma module 170 may serve to preprocess the flexible substrate 10 before the deposition process. For example, the heater 160 may serve to evaporate moisture present on the upper surface, which is a deposition surface of the flexible substrate 10 supplied from the extracting roller 110, and to separate air molecules adsorbed on the upper surface of the flexible substrate from the surface of the flexible substrate. As the heater 160, various heaters including an infrared heater may be used. In addition, the plasma module 170 may serve to remove foreign substances adsorbed on the surface of the flexible substrate 10.

Figure 2:
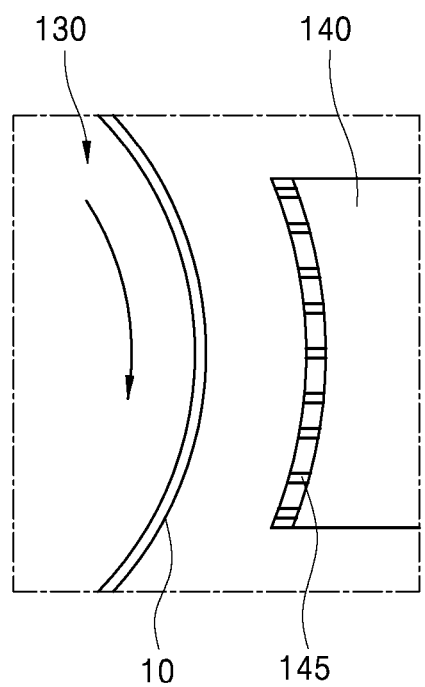
FIG. 2 shows an example of a drum and a gas supply of FIG. 1 according to one embodiment.

FIG. 2 shows an example of the drum and the gas supply of FIG. 1.

Referring to FIG. 2, the gas supply 140 may include a plurality of nozzles 145 on a surface thereof. The process gas such as precursor gas or atmospheric gas may be sprayed onto the flexible substrate 10 through the plurality of nozzles 145 to form a desired deposition layer on the surface of the flexible substrate 10.

Also, a surface of the gas supply 140 may be concave in a width direction because a widthwise cross-section of the drum 130 is convex, so that a distance between each nozzle 145 and the flexible substrate 10 to be deposited may be maintained constant to form a deposition layer with uniform thickness. If the gas supply 140 is flat, a distance between a nozzle located at a central portion of the gas supply 140 and the flexible substrate may be shorter than a distance between a nozzle located at an edge portion of the gas supply 140 and the flexible substrate, resulting in a thickness variation of the deposition layer formed on the flexible substrate. However, when the surface of the gas supply 140 is concave in a width direction, the distance between the nozzle located at the central portion and the flexible substrate may be same as the distance between the nozzle located at the edge portion and the flexible substrate, thereby improving the thickness uniformity of the deposition layer.

Figure 3:
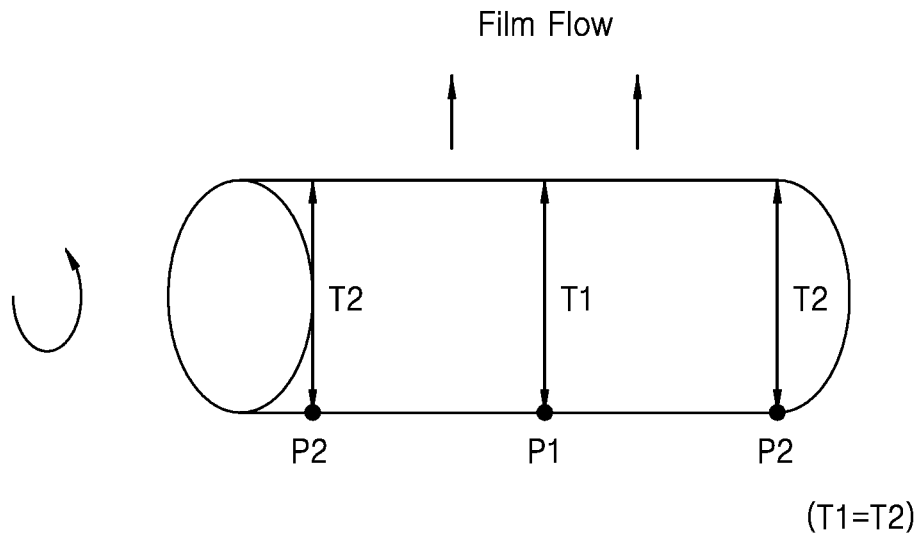
FIG. 3 shows an example of a cylindrical drum for roll-to-roll deposition according to the related art.
Figure 4:
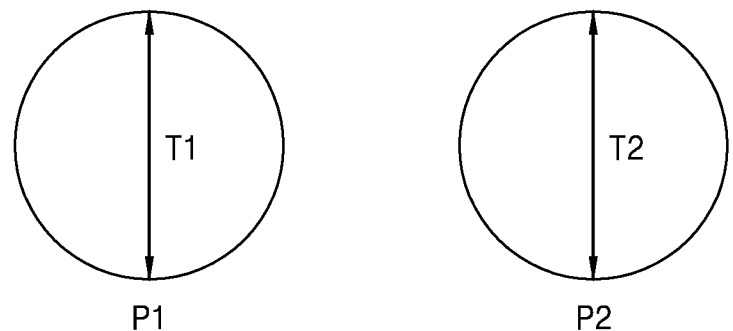
FIG. 4 shows widths of a longitudinal central portion and a longitudinal edge portion of a drum shown in FIG. 3

FIG. 3 shows an example of a cylindrical drum with a roll-to-roll deposition according to the related art, and FIG. 4 shows widths of a longitudinal central portion and a longitudinal edge portion of a drum shown in FIG. 3

Referring to FIGS. 3 and 4, a conventional cylindrical drum for roll-to-roll deposition, may be circular in a widthwise cross-section, and a width T1 of a longitudinal central portion P1 of the drum is equal to a width T2 of a longitudinal edge portion P2 of the drum (T1=T2).

As described above, in a roll-to-roll deposition process, wrinkles may occur on the flexible substrate due to heat or tension. When deposition is performed in a state where wrinkles are present on the flexible substrate, a deposition thickness of a portion where the wrinkles occur and a deposition thickness of a portion where the wrinkles do not occur may be different from each other. Such a non-uniform thickness of the deposited film may lead to over-etching of a wrinkle portion resulting from the thickness variation in a subsequent etching process. The over-etching may bring about damage to a lower film, and a step coverage defect between the lower film and an upper film. Also, the non-uniform thickness of the deposition layer may bring about various problems such as, for example, a misalignment in an exposure process, and the like. Therefore, there is a need to remove the wrinkles occurring on the flexible substrate before or at the same time of the roll-to-roll deposition process.

Here, when widths of opposite longitudinal edge portions P2 of the drum are each the same as a width of a longitudinal central portion P1 of the drum as shown in FIG. 3, substantially same tension may be applied from a widthwise central portion of the flexible substrate to a widthwise edge portion of the flexible substrate. The wrinkles occurring on the flexible substrate tends to be pushed toward a portion where the tension is relatively weak. When the widths of the opposite longitudinal edge portions P2 of the drum are the same as the width of the longitudinal central portion P1 of the drum, substantially the same tension may be applied from the widthwise central portion of the flexible substrate to the widthwise edge portion of the flexible substrate as shown in FIG. 3. Accordingly, the wrinkles may not be pushed out, and thus are likely to remain when the deposition is performed.

Figure 5:
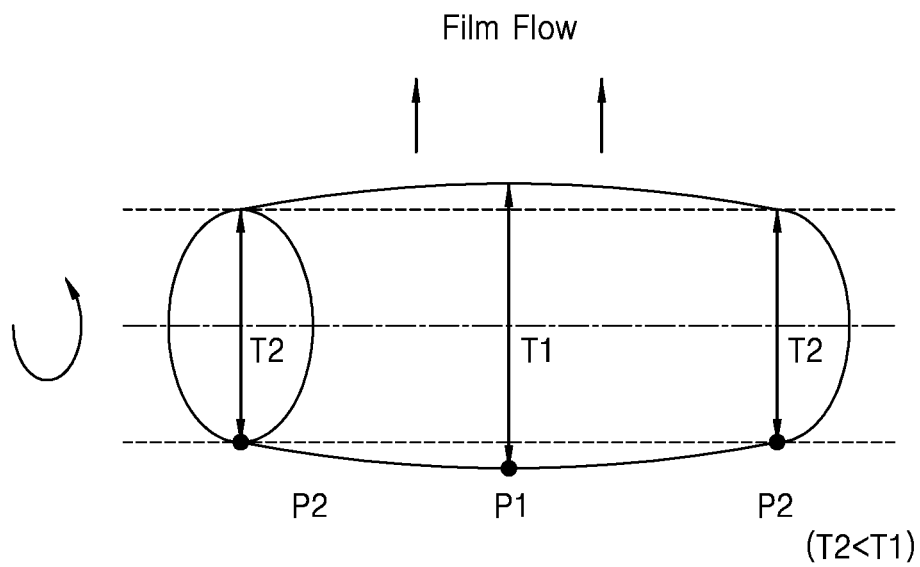
FIG. 5 shows an example of a cylindrical drum for roll-to-roll deposition according to an embodiment of the present disclosure.
Figure 6:
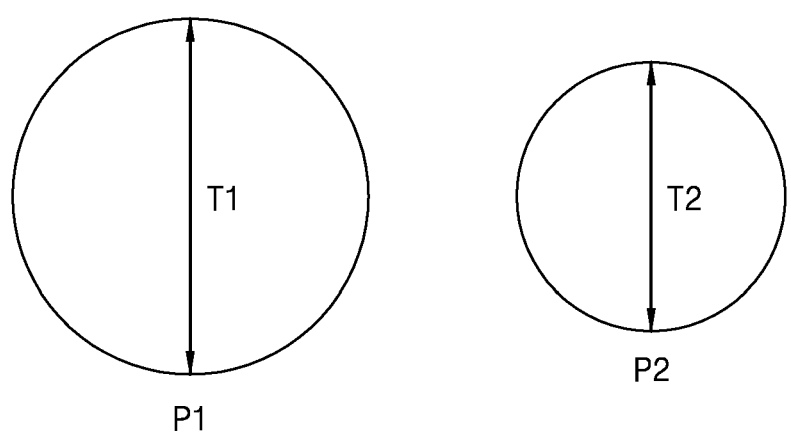
FIG. 6 shows a width of a longitudinal central portion of the drum and widths of longitudinal edge portions of the drum shown in FIG. 5.

FIG. 5 shows an example of a cylindrical drum for roll-to-roll deposition according to an embodiment of the present disclosure, and FIG. 6 shows a width of a longitudinal central portion of the drum and widths of longitudinal edge portions of the drum shown in FIG. 5.

Referring to FIGS. 5 and 6, the cylindrical drum for roll-to-roll deposition according to an embodiment of the present disclosure may rotate about a longitudinal axis and may be circular in a widthwise cross-section. This drum may be the same as the cylindrical drum according to the related art shown in FIGS. 3 and 4. However, the drum for roll-to-roll deposition according to embodiments of the present disclosure may have a shape in which widths T2 of the opposite longitudinal edge portions P2 of the drum are each narrower than a width T1 of the longitudinal central portion P1 of the drum (T1>T2). Since a force applied to the same area is proportional to mass, a larger force may be applied to the longitudinal central portion P1 of the drum than the opposite longitudinal edge portions P2 of the drum.

Accordingly, the tension applied to the widthwise central portion of the flexible substrate may be larger than the tension applied to the widthwise edge portion of the flexible substrate, and thus the wrinkles occurring on a central portion of the flexible substrate may be easily pushed to the widthwise edge portion of the substrate to which relatively lower tension is applied. As a result, the deposition process may be performed in a state where the wrinkles are removed from the flexible substrate, thereby resolving a problem of the non-uniform thickness of the deposition layer.

Preferably, the width of the drum may gradually decrease from the longitudinal central portion P1 thereof to the opposite longitudinal edge portions P2 thereof as shown in FIG. 5.

When the width discontinuously decreases from the longitudinal central portion P1 of the drum to the opposite longitudinal edge portions P2 of the drum, for example, in a stepped manner, a partial area of the flexible substrate 10 may not be in contact with the drum, and as a result deposition stability may be lowered. Accordingly, when the width gradually decreases from the longitudinal central portion P1 of the drum to the opposite longitudinal edge portions P2 of the drum, the flexible substrate 10 may be more stably in face-to-face contact with the surface of the drum 130, thereby preventing the deposition stability from being lowered.

Preferably, the widths T2 of the opposite longitudinal edge portions P2 of the drum may be 90% or more of the width T1 of the longitudinal central portion P1 of the drum (0.9×T1≤T2<T1). When the widths T2 of the opposite longitudinal edge portions P2 of the drum are each excessively narrower than the width T1 of the longitudinal central portion P1 of the drum, the deposition may be performed in a state that the flexible substrate is in contact with only the longitudinal central portion P1 of the drum, and is lifted at the longitudinal opposite edge portions P2 of the drum without being in contact therewith. Therefore, by making the widths of the opposite longitudinal edge portions P2 of the drum 90% or more of the width of the longitudinal central portion P1 of the drum, the substrate may be stably brought into face-to-face contact with the surface of the drum.

Figure 7A:
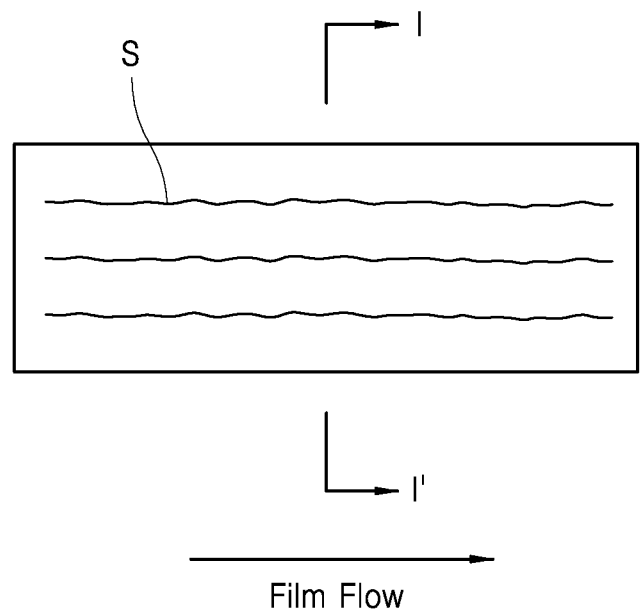
FIG. 7A and FIG. 7B are respectively a plan view and a cross-sectional view showing an example in which wrinkles are present on a flexible substrate in a roll-to-roll deposition process.
Figure 7B:
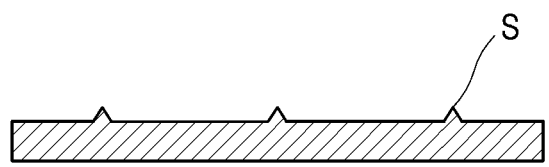

FIG. 7A is a plan view and FIG. 7B a widthwise cross-sectional view of a substrate showing an example in which wrinkles are present on a flexible substrate in a roll-to-roll deposition process, showing a state of the substrate when using the cylindrical drum according to the related art shown in FIG. 3.

Referring to FIG. 7, when wrinkles S are present on the flexible substrate, the wrinkles S may have a shape that extends along a longitudinal direction of the flexible substrate. Therefore, the surface of the flexible substrate may not be locally flat due to the wrinkles S. As a result, when an organic substance or inorganic substance is deposited on the flexible substrate, a thickness of a deposition layer formed on a portion where the wrinkles S occur may be different from that formed on a portion where the wrinkles S do not occur.

Figure 8A:
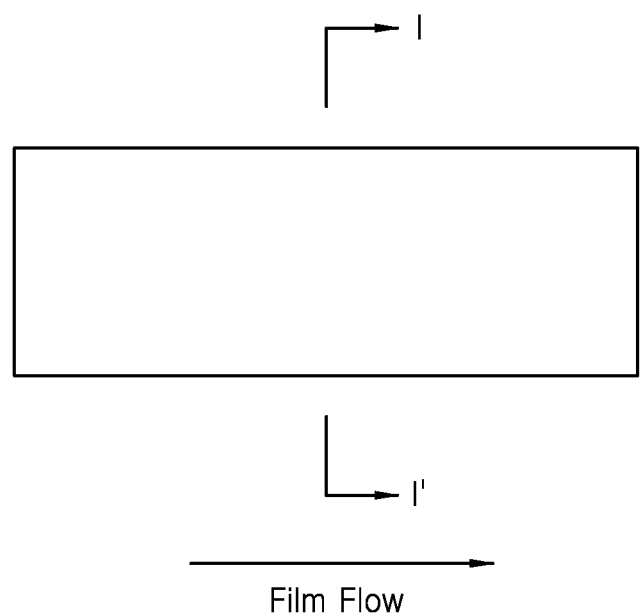
FIG. 8A and FIG. 8B are respectively a plan view and a cross-sectional view showing an example in which wrinkles are not present on a flexible substrate in a roll-to-roll deposition process.
Figure 8B:

FIG. 8A which is a plan view and FIG. 8B a widthwise cross-sectional view of a substrate showing an example in which wrinkles are not present on a flexible substrate in a roll-to-roll deposition process, shows a state of the substrate when using the cylindrical drum shown in FIG. 5.

In FIG. 8B, no wrinkle is present on the flexible substrate, unlike FIG. 7. Accordingly, when the organic substance or inorganic substance is deposited on the flexible substrate, the deposited film may have uniform thickness in overall.

Figure 9A:
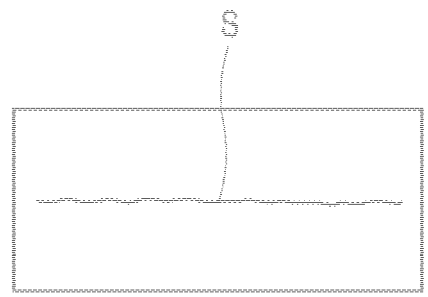
FIGS. 9A, 9B, and 9C schematically shows a process of removing wrinkles of a flexible substrate in a roll-to-roll deposition process.
Figure 9B:
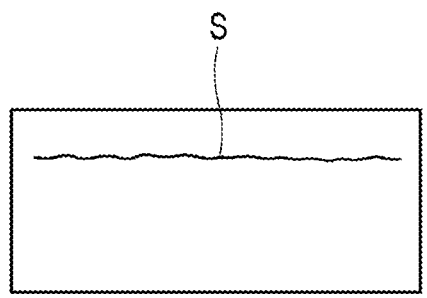
Figure 9C:
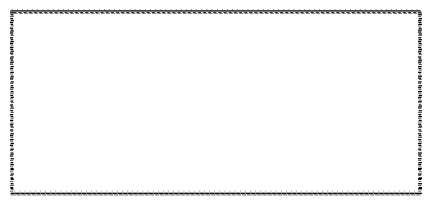

FIGS. 9A, 9B, and 9C schematically shows a process of removing wrinkles of a flexible substrate in a roll-to-roll deposition process when using the cylindrical drum according to an embodiment of the present disclosure.

Referring to FIG. 9, the wrinkles S occurring on the widthwise central portion of the flexible substrate as shown in FIG. 9A may gradually move toward the longitudinal edge portion of the drum to which lower tension is applied while being in contact with the cylindrical drum having a shape in which the widths of the opposite longitudinal edge portions are each narrower than the width of the longitudinally central portion as shown in FIG. 9B, and may be finally removed as shown in FIG. 9C.

Referring to FIG. 1, a structure of the cylindrical drum for roll-to-roll deposition according to an embodiment of the present disclosure may be applied to other rollers. For example, the rollers 150, which are additionally disposed between the extracting roller 110 and the drum 130 so as to switch a direction of the flexible substrate being transferred and adjust tension, the rollers 150 also may have a shape in which the widths of the opposite longitudinal edge portions are each narrower than the width of the longitudinally central portion, thereby further improving the efficiency of removing the wrinkles of the flexible substrate 10.

In addition, the gas supply 140 may have a concave surface in not only a width direction but also a longitudinal direction to correspond to a surface shape of the cylindrical drum as shown in FIG. 5. This structure may allow a distance from the gas supply 140 to the flexible substrate 10 in contact with the drum 130, i.e., a deposition distance, to be substantially the same.

Figure 10:
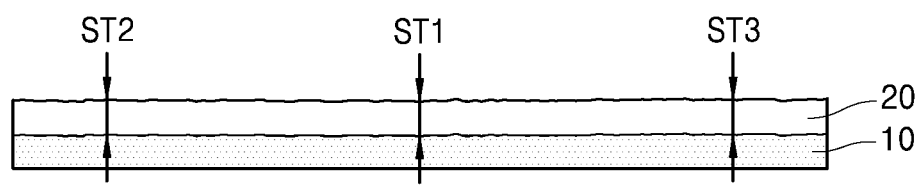
FIG. 10 shows an example of a cross-section of a flexible film on which a deposition layer is disposed when the cylindrical drum of FIG. 5 is applied.
Figure 11:
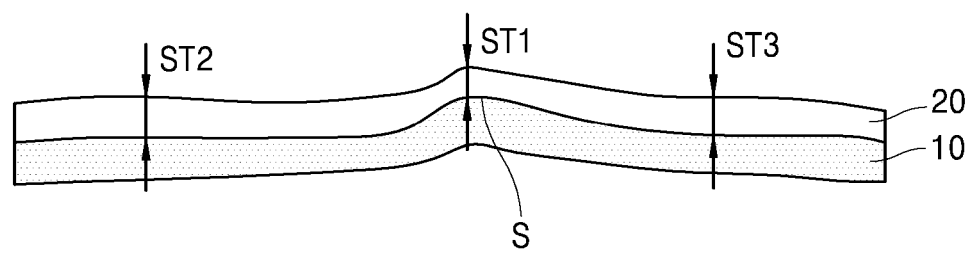
FIG. 11 shows an example of a cross-section of a flexible film on which a deposition layer is disposed when the cylindrical drum of FIG. 3 is applied.

FIG. 10 shows an example of a cross-section of a flexible film on which a deposition layer is disposed when the cylindrical drum of FIG. 5 is applied, and FIG. 11 shows an example of a cross-section of a flexible film on which a deposition layer is disposed when the cylindrical drum of FIG. 3 is applied.

FIGS. 10 and 11 each show a resultant structure after forming a deposition layer 20 made of a silicon nitride having a thickness of about 560 nm on the flexible substrate 10 made of a polyimide material having a thickness of about 100 μm through a CVD process using the roll-to-roll deposition apparatus shown in FIG. 1. An actual thickness of the flexible substrate 10 is significantly larger than that of the deposition layer 20, but the thickness of the deposition layer 20 is illustrated slightly more largely in FIGS. 10 and 11 for ease of explanation.

Referring to FIG. 10, when using a drum having a shape in which the widths of opposite longitudinal edge portions are each narrower than that of the longitudinal central portion as shown in FIG. 5, a thickness ST1 of the deposition layer formed on the widthwise central portion of the flexible substrate may be substantially the same as thicknesses ST2 and ST3 of the deposition layer formed on the width edge portions of the flexible substrate. Thus, it is possible to form the deposition layer 20 having a small widthwise thickness variation, preferably a widthwise thickness variation of 5% or less, on the flexible substrate 10 although the roll-to-roll process is used.

On the other hand, referring to FIG. 11, when using a drum having a shape in which the widths of opposite longitudinal edge portions are each same as that of the longitudinal central portion as shown in FIG. 3, a thickness ST1 of the deposition layer formed on the widthwise central portion of the flexible substrate may be relatively thinner than thicknesses ST2 and ST3 of the deposition layer formed on the width edge portions of the flexible substrate.

As a result, in FIG. 10, the wrinkles S of the flexible substrate 10 may be removed, and the deposition layer may have excellent thickness uniformity in a width direction of the flexible substrate 10, whereas, in FIG. 11, the wrinkles S of the flexible substrate 10 may remain and the deposition layer may have relatively poor thickness uniformity in a width direction of the flexible substrate 10.

As described above, it is possible to remove the wrinkles occurring on the flexible substrate when the roll-to-roll process is performed by applying the drum having a shape in which the widths of opposite longitudinal edge portions are each narrower than that of the longitudinally central portion, thereby making it possible to manufacture a film roll having the deposition layer with excellent widthwise thickness uniformity.

The present disclosure is described with reference to embodiments described herein and accompanying drawings, but is not limited thereto. It should be apparent to those skilled in the art that various changes or modifications which are not exemplified herein but are still within the spirit and scope of the present disclosure may be made.

| Description of Symbols | |
|---|---|
| 10: Flexible substrate | 20: Deposition layer |
| 101: Process chamber | 102: Preliminary chamber |
| 103: Opening and closing slit | 110: Extracting roller |
| 120: Winding roller | 130: Drum |
| 135: Heating element | 140: Gas supply |
| 145: Nozzle | 150: Roller |
| 160: Heater | 170: Plasma module |

What is claimed is:

1. A roll-to-roll deposition apparatus, comprising:
a preliminary chamber;
a process chamber separated from the preliminary chamber, the process chamber having a first end having a first height and a second end having a second height that is a same as the first height;
a slit disposed between the preliminary chamber and the process changer, the slit configured to be openable and closeable;
an extracting roller disposed in the preliminary chamber and configured to continuously supply a flexible substrate through the slit, the extracting roller being circular in a widthwise cross-section and having a shape in which each of a first longitudinal end portion and a second longitudinal end portion that is opposite the first longitudinal end portion has a width that is substantially the same as a width of a longitudinal central portion of the extracting roller, the longitudinal central portion of the extracting roller between the first longitudinal end portion of the extracting roller and the second longitudinal end portion of the extracting roller;
a drum that is entirely disposed in the process chamber such that the drum is closer to the second end of the process chamber than the first end of the process chamber, the drum configured to be in contact with a lower surface of the flexible substrate supplied from the extracting roller through the slit and the flexible substrate to be rotated about a longitudinal axis of the drum, the drum being circular in a widthwise cross-section and having a shape in which each of a first longitudinal end portion of the drum and a second longitudinal end portion of the drum that is opposite the first longitudinal end portion of the drum has a width that is smaller than a width of a longitudinal central portion of the drum, the longitudinal central portion of the drum between the first longitudinal end portion of the drum and the second longitudinal end portion of the drum;
a gas supply disposed at least partially within the process chamber at the second end of the process chamber, the gas supply having a surface that faces the drum such that the surface of the gas supply is closer to an upper surface of the flexible substrate than the lower surface of the flexible substrate in the process chamber, the gas supply to supply process gas to the upper surface of the flexible substrate in the process chamber; and
a winding roller disposed in the preliminary chamber, the winding roller configured to wind the flexible substrate transferred from the drum,
wherein each of the width of the first longitudinal end portion of the drum and the width of the second longitudinal end portion of the drum is at least 90% of the width of the longitudinal central portion of the drum, but less than the width of the longitudinal central portion of the drum,
wherein the surface of the gas supply that faces the substrate is concave along a length of the surface in a width direction of the drum and is concave along a length of the surface in a longitudinal direction of the drum such that a distance between the surface of the gas supply and the upper surface of the flexible substrate is substantially constant along a length of the upper surface of the flexible substrate in the width direction and along a length of the upper surface of the flexible substrate in the longitudinal direction,
wherein a heating element is disposed on a surface of or inside of the drum.

2. The roll-to-roll deposition apparatus of claim 1, wherein a width of the drum gradually decreases from the longitudinal central portion of the drum towards the first longitudinal end portion, and gradually decreases from the longitudinal central portion of the drum towards the second longitudinal end portion.

3. The roll-to-roll deposition apparatus of claim 1, further comprising a plurality of rollers between the extracting roller and the drum,
wherein at least one of the plurality of rollers is disposed in the process chamber and is circular in a widthwise cross-direction and has a shape in which each of a first longitudinal end portion and a second longitudinal end portion that is opposite the first longitudinal end portion have a width that is smaller than a width of a longitudinal central portion that is between the first longitudinal end portion and the second longitudinal end portion of the at least one of the plurality of rollers.

4. The roll-to-roll deposition apparatus of claim 1, wherein the surface of the gas supply is entirely disposed in the process chamber.

\* \* \* \* \*